(12) United States Patent
Yogo et al.

(10) Patent No.: US 10,182,506 B2
(45) Date of Patent: Jan. 15, 2019

(54) INVERTER-INTEGRATED ELECTRIC COMPRESSOR

(71) Applicant: MITSUBISHI HEAVY INDUSTRIES THERMAL SYSTEMS, LTD., Minato-ku, Tokyo (JP)

(72) Inventors: Ichiro Yogo, Aichi (JP); Akinori Yoshioka, Aichi (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 90 days.

(21) Appl. No.: 15/113,980

(22) PCT Filed: Mar. 17, 2015

(86) PCT No.: PCT/JP2015/057822
§ 371 (c)(1),
(2) Date: Jul. 25, 2016

(87) PCT Pub. No.: WO2015/141654
PCT Pub. Date: Sep. 24, 2015

(65) Prior Publication Data
US 2016/0353595 A1 Dec. 1, 2016

(30) Foreign Application Priority Data

Mar. 20, 2014 (JP) ................. 2014-058380

(51) Int. Cl.
*H05K 5/03* (2006.01)
*F04B 39/12* (2006.01)
*H05K 5/06* (2006.01)
*H05K 7/14* (2006.01)
*F04B 35/04* (2006.01)
(Continued)

(52) U.S. Cl.
CPC ............. *H05K 5/03* (2013.01); *B60H 1/3222* (2013.01); *B60H 1/3227* (2013.01); *F04B 35/04* (2013.01);
(Continued)

(58) Field of Classification Search
CPC ... H02K 5/04; H02K 5/10; H02K 5/22; B60H 1/3222
(Continued)

(56) References Cited

U.S. PATENT DOCUMENTS 5,736,799 A 4/1998 Harano et al.
9,343,940 B2 * 5/2016 Fukasaku ................. H02K 5/22
(Continued)

FOREIGN PATENT DOCUMENTS

CN 1120258 A 4/1996
CN 102046976 A 5/2011
(Continued)

OTHER PUBLICATIONS

Office Action issued in corresponding Chinese Patent Application No. 201580006086.1 dated Apr. 26, 2017, with English language translation.

*Primary Examiner* — Hanh Nguyen
(74) *Attorney, Agent, or Firm* — Birch, Stewart, Kolasch & Birch, LLP.

(57) ABSTRACT

An inverter-integrated electric compressor according to the present invention is provided with an inverter case for forming an inverter-accommodating space for housing an inverter device, and an inverter cover configured to close an opening of the inverter-accommodating space. The inverter case is assembled with the inverter cover using a spigot joint, and when the inverter cover closes the opening of the inverter-accommodating space, an end-face-opposing face that opposes an end face of the inverter cover is formed. Such an inverter-integrated electric compressor may make it unlikely for the end face of the inverter cover to be exposed to corrosive environments, and may suppress corrosion of the end face of the inverter cover.

3 Claims, 4 Drawing Sheets

(51) Int. Cl.
  *F04C 18/02* (2006.01)
  *H02K 11/33* (2016.01)
  *B60H 1/32* (2006.01)
  *H05K 5/02* (2006.01)
  *H02K 7/14* (2006.01)

(52) U.S. Cl.
  CPC .......... *F04B 39/12* (2013.01); *F04C 18/0215* (2013.01); *H02K 7/14* (2013.01); *H02K 11/33* (2016.01); *H05K 5/0217* (2013.01); *H05K 5/062* (2013.01); *H05K 7/1432* (2013.01); *B60H 2001/3292* (2013.01); *F04C 2240/30* (2013.01); *F04C 2240/808* (2013.01)

(58) Field of Classification Search
  USPC .............................................. 310/68 D, 68 C
  See application file for complete search history.

(56) References Cited

U.S. PATENT DOCUMENTS

| | | | |
|---|---|---|---|
| 2002/0041812 A1* | 4/2002 | Yokomachi | F04B 27/1036 417/269 |
| 2010/0074772 A1 | 3/2010 | Hoshino et al. | |
| 2011/0091337 A1* | 4/2011 | Suzuki | F01C 21/10 417/410.1 |
| 2011/0175470 A1* | 7/2011 | Kinoshita | F04B 35/04 310/71 |
| 2011/0193452 A1* | 8/2011 | Yakushiji | F04B 39/06 310/68 D |
| 2013/0082550 A1* | 4/2013 | Fleming | H02K 9/06 310/63 |
| 2013/0328424 A1* | 12/2013 | Goto | H02K 5/18 310/64 |

FOREIGN PATENT DOCUMENTS

| | | |
|---|---|---|
| CN | 102244207 A | 11/2011 |
| JP | 2003-65285 A | 3/2003 |
| JP | 2008-215236 A | 9/2008 |
| JP | 2010-59941 A | 3/2010 |
| JP | 2012-47139 A | 3/2012 |
| JP | 2012-82763 A | 4/2012 |
| JP | 2013-60816 A | 4/2012 |

* cited by examiner

INVERTER-INTEGRATED ELECTRIC COMPRESSOR

TECHNICAL FIELD

The present invention relates to an inverter-integrated electric compressor having an inverter device integrally incorporated into a housing of the electric compressor.

BACKGROUND ART

An inverter-integrated electric compressor is known in which an inverter device is integrally incorporated into the electric compressor. The inverter-integrated electric compressor is used as a compressor that compresses a refrigerant of an air conditioning device installed in a vehicle, such as an electric vehicle or a hybrid vehicle. High voltage direct current power supplied from a power source unit installed in the vehicle is converted by the inverter device to three-phase alternating current power of a required frequency, and the electric compressor is driven using the three-phase alternating current power. The inverter device is integrated with the electric compressor by being incorporated into an inverter-accommodating section provided on the outer circumference of a housing of the electric compressor (see Patent Document 1 and Patent Document 2).

CITATION LIST

Patent Documents

Patent Document 1: Japanese Unexamined Patent Application Publication No. 2013-60816A
Patent Document 2: Japanese Unexamined Patent Application Publication No. 2012-47139A

SUMMARY OF INVENTION

Technical Problem

In order to suppress vibrations, an inverter cover that closes the inverter-accommodating section is formed of laminated steel sheets (laminated damping steel sheets). When the laminated steel sheets are used as the inverter cover, corrosion resistance is improved by applying a cation electrodeposition coating, for example. Even when the laminated steel sheets to which the cation electrodeposition coating has been applied are adopted as the inverter cover, due to the influence of burrs and sags formed on the end face during processing, the film thickness of the cation electrodeposition coating on the end face sometimes becomes thin, and the end face is more easily corroded. Peeling of the laminated steel sheets occurs when the end face is corroded, and this is not desirable for the inverter cover in terms of appearance or functionality.

In light of the foregoing, an object of the present invention is to provide an inverter-integrated electric compressor that improves corrosion resistance of an inverter cover.

Solution to Problem

The inverter-integrated electric compressor of the present invention employs the following means to solve the problems described above.

Specifically, an inverter-integrated electric compressor according to a first aspect of the present invention integrally incorporates an inverter device converting direct current power to three-phase alternating current power, and an electric compressor compressing a refrigerant using the three-phase alternating current power. The inverter-integrated electric compressor according to the present invention includes an inverter case forming an inverter-accommodating space for housing the inverter device, and an inverter cover configured to close an opening of the inverter-accommodating space. When the inverter cover closes the opening, an end-face-opposing face, which opposes an end face of the inverter cover, is formed in the inverter case.

By the end face of the inverter cover opposing the end-face-opposing face of the inverter case, such an inverter-integrated electric compressor may make it unlikely for the end face of the inverter cover to be exposed to corrosive environments, and the corrosion resistance of the end face of the inverter cover may be improved.

The inverter-integrated electric compressor according to the first aspect may further include a liquid gasket closing a gap formed between the end face and the end-face-opposing face.

By the liquid gasket covering the end face of the inverter cover, such an inverter-integrated electric compressor may make it unlikely for the end face of the inverter cover to be exposed to corrosive environments, and the corrosion resistance of the end face of the inverter cover may be improved.

When the inverter cover closes the opening, a protruding portion in the inverter case may protrude further than an outer-side face of the inverter cover, where the end-face-opposing face is formed on the protruding portion.

With such an inverter-integrated electric compressor, even when the liquid gasket pressed out from the gap between the inverter cover and the inverter case is wiped, the liquid gasket may be caused to remain on the end face of the inverter cover. This may make it unlikely for the end face of the inverter cover to be exposed to corrosive environments, and the corrosion resistance of the end face of the inverter cover may be improved.

The inverter cover may be formed of laminated steel sheets.

The laminated steel sheets have a configuration in which steel sheets are laminated with plate-shaped bodies having elasticity, such as rubber and resin. Thus, if the end face is corroded, the plurality of layers peel apart from each other more easily, and this is not desirable in terms of the appearance or functionality. Such an inverter-integrated electric compressor may inhibit the corrosion of the end face of the inverter cover, and thus the laminated steel sheets whose end face would easily corrode may be adopted as the inverter cover.

The inverter cover may be covered by a film formed by cation electrodeposition coating.

Due to the influence of burrs and sags formed on the end face of the inverter cover during processing of the inverter cover, of the film of the cation electrodeposition coating, the film that covers the end face of the inverter cover becomes thinner than the film covering sections other than the end face of the inverter cover. Thus, the end face of the inverter cover is more easily corroded than the sections other than the end face. Such an inverter-integrated electric compressor may inhibit the corrosion of the end face of the inverter cover, and thus a material subjected to cation electrodeposition coating may be adopted as the inverter cover.

Advantageous Effects of Invention

The inverter-integrated electric compressor according to the present invention may improve the corrosion resistance of the end face of the inverter cover.

DESCRIPTION OF EMBODIMENTS

An inverter-integrated electric compressor according to an embodiment of the present invention is described below, with reference to the accompanying drawings.

Figure 1:
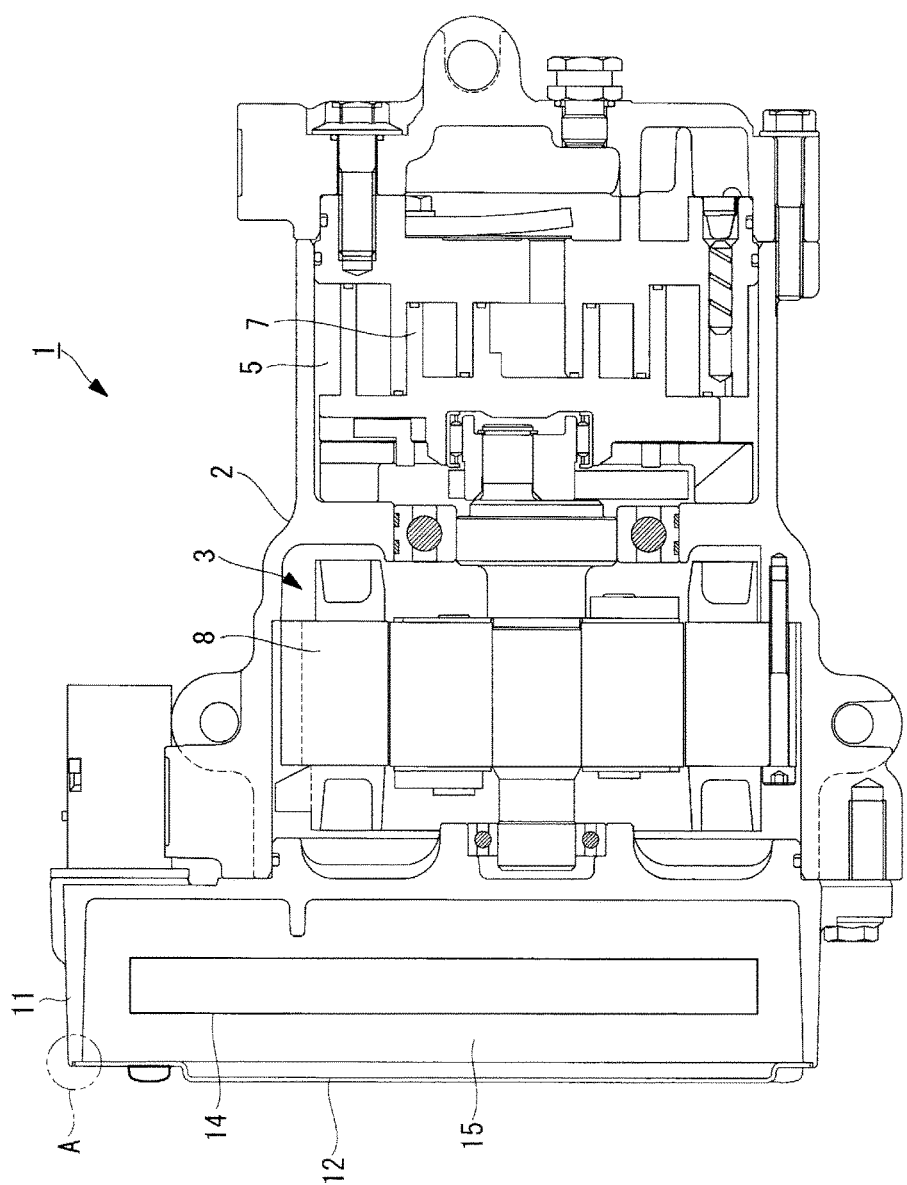
FIG. 1 is a vertical cross-sectional view of an inverter-integrated electric compressor according to an embodiment of the present invention.

An inverter-integrated electric compressor 1 is provided in an air conditioning device installed in a vehicle, such as an electric vehicle or a hybrid vehicle, and is provided with a housing 2 and an electric compressor 3, as illustrated in FIG. 1. An electric compressor-accommodating space 5 is formed inside the housing 2. Further, an intake port and a discharge port (both not illustrated) are formed in the housing 2. The electric compressor 3 is provided with an electric motor 8 and a compressor 7. The electric motor 8 is arranged in the electric compressor-accommodating space 5, and generates rotational motive power using a three-phase alternating current power supplied from an inverter device that will be described later. The compressor 7 is arranged in the electric compressor-accommodating space 5. The compressor 7 uses the rotational motive power generated by the electric motor 8, compresses a refrigerant supplied from outside via the intake port, and supplies the compressed refrigerant to a condenser via the discharge port. The air conditioning device performs an air conditioning operation inside the vehicle, using the refrigerant compressed by the inverter-integrated electric compressor 1.

The inverter-integrated electric compressor 1 is further provided with an inverter case 11, an inverter cover 12, and an inverter device 14. The inverter case 11 is fixed to the housing 2 so as to close an opening of the electric compressor-accommodating space 5 of the housing 2. An inverter-accommodating space 15 is further formed inside the inverter case 11. The inverter cover 12 is formed generally in a plate shape, and is fixed to the inverter case 11 so as to close an opening of the inverter-accommodating space 15 formed in the inverter case 11. The inverter device 14 is arranged in the inverter-accommodating space 15. The inverter device 14 converts direct current power supplied from a power source unit (not illustrated) to three-phase alternating current power, and supplies the three-phase alternating current power to the electric motor 8.

Figure 2:
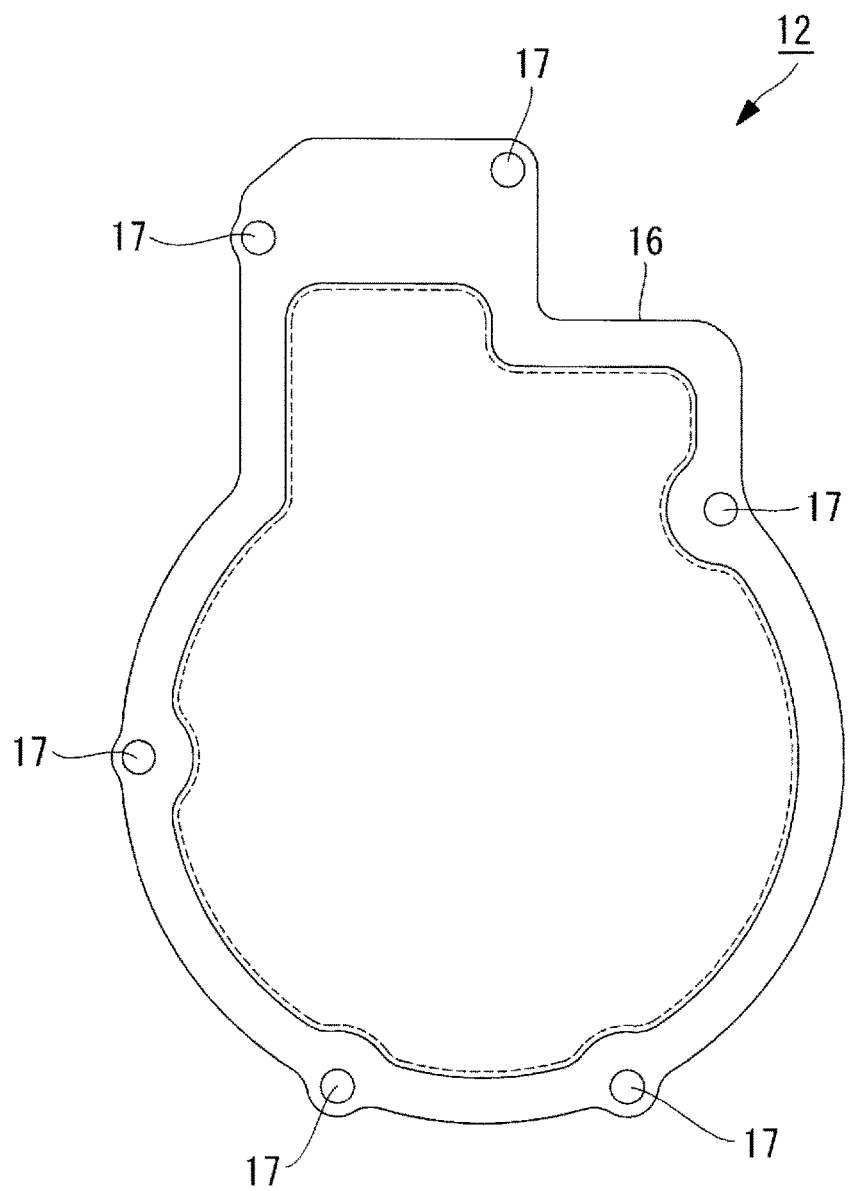
FIG. 2 is a plan view of an inverter cover provided on the inverter-integrated electric compressor.

As illustrated in FIG. 2, the inverter cover 12 is formed in a complex shape having a plurality of curved sections with differing curvatures, and an edge 16 is curved in a complex manner. A plurality of through-holes 17 are further formed in the inverter cover 12. A plurality of screw holes (not illustrated) are formed in the inverter case 11, in positions corresponding to the plurality of through-holes 17. The inverter-integrated electric compressor 1 is further provided with a plurality of screws (not illustrated) in positions corresponding to the plurality of through-holes 17. The plurality of screws each penetrate through the plurality of through-holes 17, and are each screwed into the plurality of screw holes, thereby fixing the inverter cover 12 to the inverter case 11.

Figure 3:
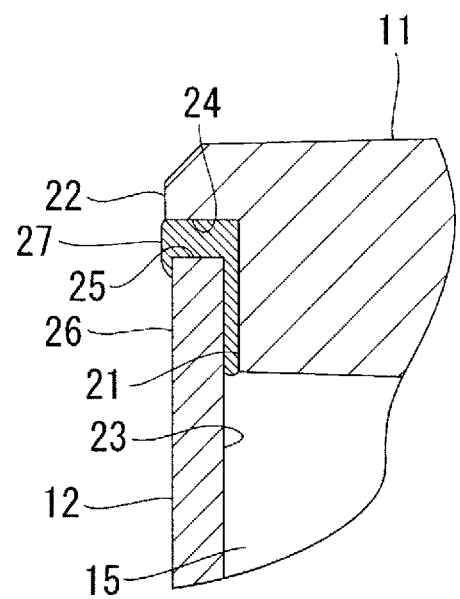
FIG. 3 is an enlarged view of a section A in FIG. 1.

As illustrated in FIG. 3, when the inverter cover 12 closes the opening of the inverter-accommodating space 15, the inverter cover 12 is attached to the inverter case 11 by a spigot joint. Specifically, an inverter cover attachment face 21 and a protruding portion 22 are formed on the inverter case 11. The inverter cover attachment face 21 is formed along a plane. The inverter cover 12 closes the opening of the inverter-accommodating space 15 by being arranged such that an accommodating space-side surface 23 of the inverter cover 12 opposes the inverter cover attachment face 21.

The protruding portion 22 is formed to protrude from the inverter cover attachment face 21, and is formed to surround the periphery of the inverter cover 12 when the inverter cover 12 closes the opening of the inverter-accommodating space 15. An end-face-opposing face 24 is formed on the protruding portion 22. The end-face-opposing face 24 is formed so as to be perpendicular to the inverter cover attachment face 21, and is formed to oppose an end face 25 of the inverter cover 12 when the inverter cover 12 closes the opening of the inverter-accommodating space 15. Further, the protruding portion 22 is formed such that the end-face-opposing face 24 is separated by a predetermined distance from the end face 25 of the inverter cover 12 (0.5 mm, for example).

The protruding portion 22 is also formed to protrude further than an outer-side face 26 of the inverter cover 12 when the inverter cover 12 closes the opening of the inverter-accommodating space 15. Specifically, the protruding portion 22 is formed to protrude from the inverter cover attachment face 21 by a distance equal to or greater than the plate thickness of the inverter cover 12 (0.8 mm, for example). A width of the end-face-opposing face 24 in the thickness direction of the inverter cover 12 is formed to be equal to or greater than the plate thickness of the inverter cover 12.

A liquid gasket 27, which is silicon-based for example, is provided in a gap formed between the inverter case 11 and the inverter cover 12. More specifically, the liquid gasket 27 is arranged between the end-face-opposing face 24 of the inverter case 11 and the accommodating space-side surface 23 of the inverter cover 12. By arranging the liquid gasket 27 in the gap between the inverter case 11 and the inverter cover 12, air or the like including moisture is inhibited from entering via the gap, and the inverter-accommodating space 15 is sealed.

Figure 4:
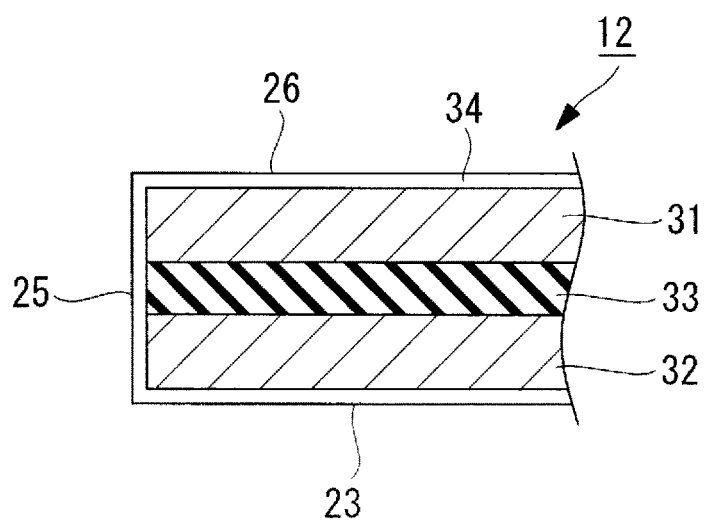
FIG. 4 is a vertical cross-sectional view of an end face of the inverter cover.

In FIG. 4, a vertical cross-section of the inverter cover 12 is illustrated. The inverter cover 12 is formed of laminated steel sheets in which a first steel sheet layer 31, a second steel sheet layer 32, and a resin layer 33 are laminated. The resin layer 33 is arranged between the first steel sheet layer 31 and the second steel sheet layer 32. Further, in the inverter cover 12, the laminated steel sheets are covered by a film 34 formed by cation electrodeposition coating. The inverter cover 12 may reduce vibrations by absorbing the vibrations using the resin layer 33.

The film thickness of a section of the film 34 that covers the end face 25 is sometimes thinner than sections of the film 34 that cover the accommodating space-side surface 23 or the outer-side face 26, due to the influence of burrs and sags formed on the end face 25 during processing, such as a blanking operation of the laminated steel sheets. For this reason, of the inverter cover 12, the end face 25 is more easily corroded.

According to the above-described configuration, the present embodiment has the following effects. In the inverter-integrated electric compressor 1, after the inverter device 14 has been installed in the inverter-accommodating space 15 of the inverter case 11, the liquid gasket 27 is applied to the inverter cover attachment face 21 and the end-face-opposing face 24 of the inverter case 11. After the liquid gasket 27 has been applied to the inverter cover attachment face 21 and the end-face-opposing face 24, the inverter cover 12 is moved so as to be perpendicular to the end-face-opposing face 24, using positioning pins, a jig, and the like, and the inverter cover 12 is attached to the inverter case 11 such that the accommodating space-side surface 23 opposes the inverter cover attachment face 21, and the end face 25 opposes the end-face-opposing face 24. After the inverter cover 12 is attached to the inverter case 11 at a predetermined position, the inverter cover 12 is fixed to the inverter case 11 using the plurality of screws.

By the inverter cover 12 being pressed against the inverter case 11 by the plurality of screws, the liquid gasket 27 is pressed out from the gap between the inverter case 11 and the inverter cover 12. By the liquid gasket 27 being pressed out from the gap between the inverter case 11 and the inverter cover 12, the end face 25 of the inverter cover 12 is more reliably covered by the liquid gasket 27. When there is a concern about the external appearance, the pressed out liquid gasket 27 is wiped using a spatula or the like, and is smoothed out. Since the protruding portion 22 of the inverter case 11 protrudes further than the outer-side face 26 of the inverter cover 12, the liquid gasket 27 reliably remains so as to cover the end face 25 of the inverter cover 12, even when the pressed out liquid gasket 27 is smoothed out.

The end face 25 of the inverter cover 12 opposes the end-face-opposing face 24 of the inverter case 11 and the end face 25 is covered by the liquid gasket 27. As a result, the end face 25 is unlikely to be exposed to corrosive environments, and corrosion of the end face 25 is suppressed.

Figure 5:
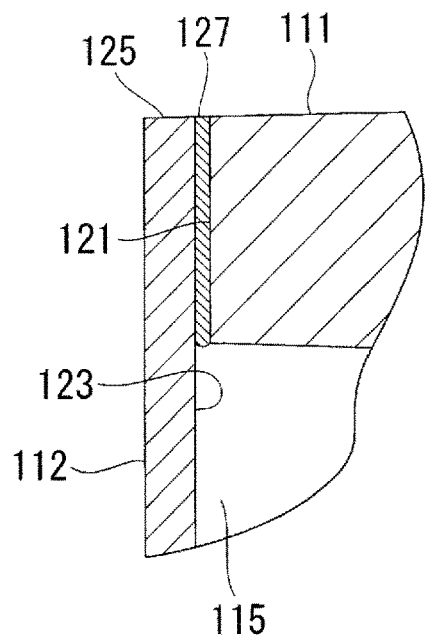
FIG. 5 is an enlarged vertical cross-sectional view of an inverter cover and an inverter case of a comparative example.

FIG. 5 illustrates an inverter case 111 and an inverter cover 112 of a comparative example. An inverter-accommodating space 115 is formed inside the inverter case 111. Further, an inverter cover attachment face 121 is formed along a plane on the inverter case 111. The inverter cover 112 is formed generally in a plate shape, and closes an opening of the inverter-accommodating space 115 by being arranged such that an accommodating space-side surface 123 of the inverter cover 112 opposes the inverter cover attachment face 121, via a liquid gasket 127. At this time, an end face 125 of the inverter cover 112 is not covered by the liquid gasket 127 and is exposed to corrosive environments, and is thus easily corroded.

In contrast to this, the inverter cover 12 according to the present embodiment is attached to the inverter case 11 by the spigot joint, and the end face 25 is thus covered by the liquid gasket 27. As a result, in comparison to the inverter cover 112 of the comparative example, the end face 25 is unlikely to be exposed to corrosive environments, and corrosion of the end face 25 is suppressed.

Figure 6:
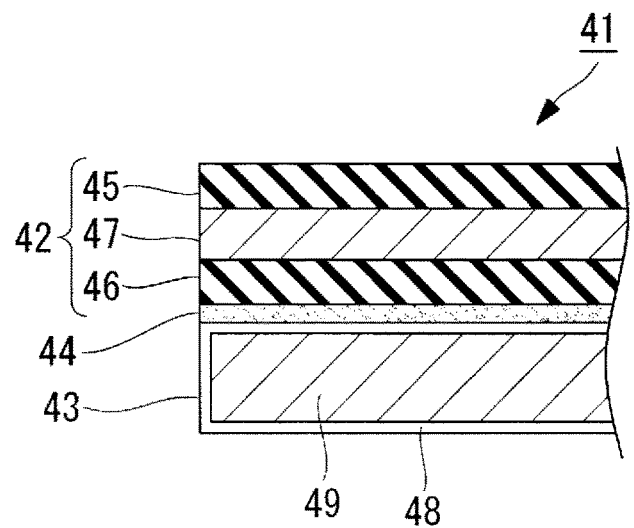
FIG. 6 is a vertical cross-sectional view of an end face of another inverter cover.

Note that the inverter cover 12 is not limited to being formed from the laminated steel sheets having the cation electrodeposition coating applied to the surface thereof, and the inverter cover 12 may be formed of another material. FIG. 6 illustrates an inverter cover 41 formed of another material. The inverter cover 41 is formed of a laminated member 42 and an aluminum plated steel sheet 43, which are bonded together via an adhesion layer 44. The laminated member 42 is provided with a first rubber layer 45, a second rubber layer 46, and a steel sheet 47. The laminated member 42 is formed by being laminated such that the steel sheet 47 is sandwiched between the first rubber layer 45 and the second rubber layer 46. The aluminum plated steel sheet 43 is formed by covering a steel sheet 49 with an aluminum film 48, formed by aluminum plating. Since the end face of the steel sheet 47 is laid bare at the end face of the inverter cover 41, the end face is easily corroded.

The inverter cover 41 is attached to the inverter case 11 in the same manner as the inverter cover 12 according to the above-described embodiment. At this time, the end face of the inverter cover 41 opposes the end-face-opposing face 24 of the inverter case 11, or the end face is covered by the liquid gasket 27. As a result, the end face is not likely to be exposed to corrosive environments, and corrosion of the end face is suppressed. Specifically, the inverter-integrated electric compressor 1 may make it unlikely for an end face of an inverter cover to be exposed to corrosive environments, and may be adopted as an inverter cover formed of a material whose end face is easily corroded.

REFERENCE SIGNS LIST

1 Inverter-integrated electric compressor
2 Housing
3 Electric compressor
5 Electric compressor-accommodating space
7 Compressor
8 Electric motor
11 Inverter case
12 Inverter cover
14 Inverter device
15 Inverter-accommodating space
21 Inverter cover attachment face
22 Protruding portion
23 Accommodating space-side surface
24 End-face-opposing face
25 End face
26 Outer-side face
27 Liquid gasket
31 First steel sheet layer
32 Second steel sheet layer
33 Resin layer
34 Film
41 Inverter cover

The invention claimed is:

1. An inverter-integrated electric compressor integrally incorporating an inverter device converting direct current power to three-phase alternating current power and an electric compressor compressing a refrigerant using the three-phase alternating current power, the inverter-integrated electric compressor comprising:
   an inverter case forming an inverter-accommodating space housing the inverter device; and
   an inverter cover configured to close an opening of the inverter-accommodating space,
   an end-face-opposing face opposing an end face of the inverter cover, being formed in the inverter case when the inverter cover closes the opening, and the inverter-integrated electric compressor further comprising:

a liquid gasket closing a gap formed between the end face and the end-face-opposing face, a protruding portion, protruding further than an outer-side surface of the inverter cover, and the end-face-opposing face being formed on the protruding portion.

2. The inverter-integrated electric compressor according to claim 1, wherein the inverter cover is formed from laminated steel sheets.

3. The inverter-integrated electric compressor according to claim 1, wherein the inverter cover is covered by a film formed by cation electrodeposition coating.

* * * * *